United States Patent [19]

Early

[11] 3,999,082

[45] Dec. 21, 1976

[54] CHARGE COUPLED AMPLIFIER

[75] Inventor: James M. Early, Palo Alto, Calif.

[73] Assignee: Fairchild Camera & Instrument Corporation, Mt. View, Calif.

[22] Filed: Feb. 4, 1974

[21] Appl. No.: 439,464

Related U.S. Application Data

[62] Division of Ser. No. 224,045, Feb. 7, 1972, Pat. No. 3,806,772.

[52] U.S. Cl. .......................... 307/221 D; 307/304; 357/24; 357/42

[51] Int. Cl.² ..................... H01L 29/78; H03F 3/70

[58] Field of Search ........... 357/24, 41, 42; 330/35, 330/54; 307/221 D

[56] References Cited

UNITED STATES PATENTS

| | | | |
|---|---|---|---|
| 3,564,442 | 2/1971 | Germann | 357/41 |
| 3,654,499 | 4/1972 | Smith | 357/24 |
| 3,760,202 | 9/1973 | Kosonocky | 357/24 |
| 3,763,480 | 10/1973 | Weimer | 357/24 |
| 3,786,441 | 1/1974 | Engeler et al. | 357/24 |

OTHER PUBLICATIONS

Tompsett, "A Simple Charge Regenerator...," in ISSCC Digest of Technical Papers, pp. 160–161, Feb. 1971, (IEEE, N.Y.), (from Int. Solid–State Circuits Conf. 1971).

Sangster, "Bucket Brigade Delay Line," *Philips Technical Review*, vol. 31, No. 4, (1970), pp. 107–110.

Primary Examiner—William D. Larkins
Attorney, Agent, or Firm—Alan H. MacPherson; Henry K. Woodward; J. Ronald Richbourg

[57] ABSTRACT

A charge coupled distributed amplifier comprises a first plurality of charge storage wells arranged along a first selected line, a second plurality of charge storage wells arranged along a second selected line, and a multiplicity of amplifier means, each amplifier means electrically coupling one charge storage well in the first plurality of wells to a corresponding charge storage well in the second plurality of wells. Charges are driven along the first and second pluralities of charge storage wells in synchronization. The same charge in the first plurality of charge storage wells creates an additional increment of charge in each charge storage well connected to the output of each amplifier means which adds in that well to the previously accumulated charge in the second plurality of charge storage wells. Thus a given amount of input charge is amplified coherently to produce a detectable output signal.

11 Claims, 9 Drawing Figures

CHARGE COUPLED AMPLIFIER

This is a division of U.S. patent application Ser. No. 244,045 filed Feb. 7, 1972 and issued as U.S. Pat. No. 3,806,772 and claims the benefit of the filing date of the earlier application for common subject matter.

BACKGROUND OF THE INVENTION

1. Field of the Invention

This invention relates to charge coupled semiconductor devices (CCD) and in particular to an amplifier constructed from charge coupled devices.

2. Prior Art

W. S. Boyle and G. E. Smith describe the basic concept of charge coupled semiconductor devices in an article published in the April, 1970 Bell System Technical Journal, page 587, entitled "Charge Coupled Semiconductor Devices".

As described by Boyle and Smith, a charge coupled device consists of a metal-insulator-semiconductor (MIS) structure in which minority carriers are stored in a "spatially defined depletion region", also called a "potential well", at the surface of the semiconductor material. The charge is moved along the surface by moving the potential minimum. A paper on page 593 of the same Bell System Technical Journal by Amelio et al., entitled "Experimental Verification of the Charge Coupled Device Concept" describes experiments carried out to demonstrate the feasibility of the charge coupled device concept.

As discussed by Boyle and Smith, charge coupled devices are potentially useful as shift registers, delay lines, and in two dimensions, as imaging or display devices.

Kim and Snow, in patent application Ser. No. 136,087 entitled "Charge Coupled Devices with Continuous Resistor Electrode" filed Apr. 21, 1971, and assigned to Fairchild Camera and Instrument Corporation, the assignee of this application, disclose a charge coupled device wherein the spaced electrodes are formed on the surface of an insulating layer in turn placed over the semiconductor substrate. Each electrode is spaced from adjacent electrodes by resistive material.

In one embodiment, the electrodes are formed with metal and a resistive material is placed between the electrodes. In another embodiment, the electrodes are formed from heavily-doped polycrystalline silicon while the resistive material comprises substantially intrinsic polycrystalline silicon. The Kim and Snow structure increases the allowable spacing between electrodes without decreasing the efficiency with which charge is tranferred from beneath one electrode to beneath an adjacent electrode.

SUMMARY OF THE INVENTION

This invention uses charge coupled devices to provide an extremely sensitive amplifier capable of amplifying signals represented by very small amounts of charge. In this specification a charge coupled device will be denoted by the letters CCD, which depending on the context can denote one or more charged coupled devices.

According to this invention, selected charge wells in two separate lines of charge coupled devices-an input CCD line and an output CCD line— are connected by charge amplifiers. A clock provides drive signals to move a charge produced in the first charge well in the input CCD line from charge well to charge well in the input CCD line.

In operation, each time a charge is deposited in one of the selected charge wells in the input CCD line, a charge amplifier creates a corresponding charge in the corresponding charge well in the output CCD line. This corresponding charge is driven from charge well to charge well in the output CCD line by the drive signals from the clock. Thus the charges in the charge wells connected to the input and output leads of the charge amplifiers are synchronously shifted along the input and output CCD lines, respectively.

Each pair of input and output charges from a given charge amplifier arrives simultaneously at the charge wells connected to the input and output leads, respectively, of the next charge amplifier. This next charge amplifier generates in its output well an additional output charge approximately equal in magnitude to the charge generated in the output well of the first charge amplifier. This additional charge adds to the transferred charge, building up the output charge as it is transferred along the output CCD line. The additional output charge produced by each charge amplifier is proportional to the same input charge. Therefore the final output charge is proportional to the number of amplification stages. By the use of distributed amplifiers, the input energy, in this case the input charge of electrons, is reused in repeated amplifier inputs and the output energy, in this case the output charge of each amplifier, is successively added to achieve far greater amplification than would otherwise be possible in a device of the same bandwidth.

The use of M charge amplifiers where M is a selected integer, results in the generation of output signal power $S_T$ which has a signal-to-noise ratio given by $$S_T/N_T = MS_o/N_s \quad (1)$$

where $S_o$ and $N_s$ are the signal power and random noise power output per stage, respectively and $N_t$ is the amplifier output noise power.

The output signal is read out from a selected charge well in the output CCD line through an output amplifier.

A feature of the invented distributed amplifier is that the output signal is proportional to as little as one electron input charge. This output signal is obtained by "charge mirroring" techniques which permit reuse of the input charge at the inputs of each of the charge amplifiers connecting selected charge wells in the input and output CCD lines. The distributed amplifier employed in this invention achieves a sufficient signal-to-noise ratio to detect individual electrons at high sampling rates. Collection of the output charge on charge-coupled electrodes provides the output charge-coupling for the distributed amplifier.

This invention uses integrated circuit techniques to combine the sensitivity of a distributed amplifier with the signal handling ability of a high level amplifier. This makes possible the achievement of the full dynamic range inherently achievable in the charge coupled photosensor. To combine the distributed amplifier with the handling ability of a high level amplifier, the two must be built together and individual photo-electron groups must be assigned to one or to the other, depending on whether the group is small or large.

DESCRIPTION OF THE DRAWING

FIG. 1b shows the electrical circuit of the cross-section shown in FIG. 1a;

FIG. 5 shows the transfer characteristic of the MOS portion of the structure shown in FIG. 1a.

DETAILED DESCRIPTION

In a conventional charge coupled device, such as disclosed in the above-mentioned article by Boyle and Smith, the charge is transferred from a given well to an adjacent well by lowering the potential of the adjacent well. To prevent this charge from being transferred back into the given well when the potential on the given well is relowered, this charge must be first transferred into another well next to the adjacent well. Then the potential on the adjacent well is held at a level sufficient to prevent this charge from being transferred back to the given well when the potential on the given well is relowered. The Boyle and Smith charge coupled device is thus a three phase system.

Figure 2:
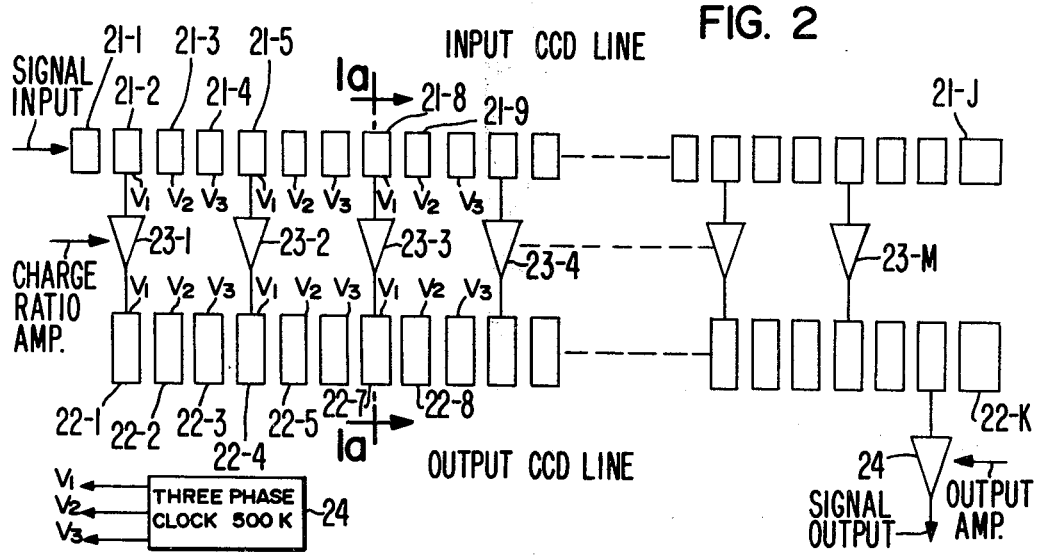
FIG. 2 shows schematically the charge coupled distributed amplifier.

FIG. 2 shows the distributed amplifier of this invention also implemented as a three-phase system. The charge generated in well 21-1 in the input CCD line 21 is transferred to well 21-2 by creating a potential minimum in well 21-2. This charge is usually generated in well 21-2 by incident radiation such as light. The presence of charge in well 21-2 causes charge amplifier 23-1 to induce, in a manner to be described shortly, additional charge in well 22-1 in the output CCD line. Potential minimums are then created in the adjacent wells 21-3 in the input CCD line and 22-2 in the output CCD line. The charges stored in wells 21-2 and 22-1 transfer, in response to these potential minimums, to these adjacent wells. Next, potential minimums are created in input well 21-4 and output well 22-3. The charges stored in wells 21-3 and 22-2 transfer to wells 21-3 and 22-2 then return to their normal values. It should be noted that the phrases "input well" and "output well" will be used in this specification to denote charge wells in the input CCD line and output CCD line, respectively.

Next, potential minimums are created at wells 21-5 and 22-4. The charges from wells 21-4 and 22-3 transfer into these adjacent charge wells in response to these potential minimums. The charge in input well 21-5 causes charge amplifier 23-2 to create additional charge in output well 22-4. Thus, the charge in input well 21-2 which induced an output charge in output well 22-1 has, by being transmitted in input well 21-5 connected to the input lead of amplifier 23-2, created additional output charge in output well 22-4. This additional charge adds to the charge created in output well 22-1. As a result, the charge resulting from the original signal detected in input well 21-1 is amplified.

This amplification continues as the charge generated at a given time in charge well 21-1 is transmitted along the input CCD line in synchronization with the transfer of the output charge generated by charge amplifiers 23-1 through 23-M along the output CCD line. The output charge is increased in amplitude by each amplification stage thus increasing the signal-to-noise ratio, as previously discussed. The output signal is produced from the charge in output well 22-(K-1) by output amplifier 24. Amplifier 24 is formed on the same chip as the input CCD line and the output CCD line.

While the operation of a three-phase charge coupled device is described above, this invention can be implemented using, for example, $n$-phase (where $n$ is a selected integer greater than 3) two phase and single phase systems of a type currently being developed.

Figure 1A:
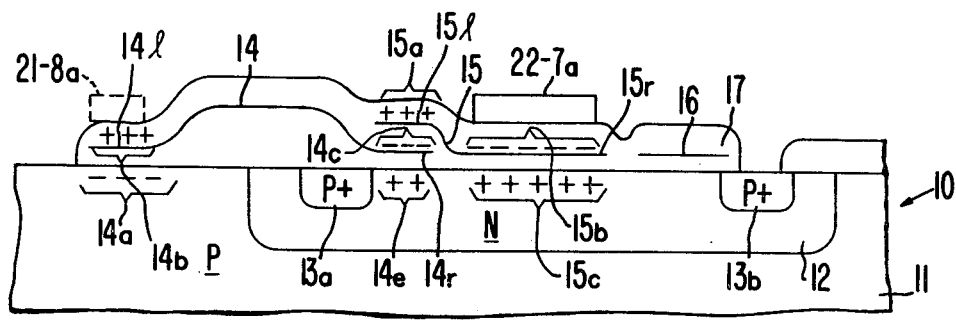
FIG. 1a shows in cross-section a charge well in the input CCD line, an electrode comprising the charge amplifier together with a second feedback electrode, and a charge well in the output CCD line.

FIG. 1a shows a cross-sectional view of the structure of FIG. 2. The cross-section is taken so as to show a charge well in the input CCD line, a charge amplifier comprising electrode 14 and feedback electrode 15, and a charge well in the output CCD line. The signal to be detected was generated at some given time in input charge well 21-1. This signal, represented by electrons 14a, has been transferred along the input CCD line and now rests in input well 21-8, connected to the input lead of charge amplifier 23-3. Electrons 14a comprise the minority carriers in P-type monocrystalline semiconductor material 11. Electrons 14a are located within a few thousand angstroms of the surface and due to this location are considered to be in the vicinity of the surface.

Electrode 14 is embedded in dielectric material 17. End 14l of electrode 14, located above charge 14a, has positive charge 14b induced in it by the presence of negative charge 14a. Positive charge 14b induces a negative charge 14c in the right end 14r of electrode 14. The right end 14r of electrode 14 is located above the channel region of an MOS device. This MOS device consists of source region 13a and drain region 13b of P+ type material formed in N-type region 12. Negative charge 14c induces additional positive charge 14e in the channel region between P+ type regions 13a and 13b. This positive charge 14e is supplied by source 13a. Source 13a is, in one embodiment, held at a given potential by an electrical bus line (not shown in FIG. 1a). The time necessary for the positive charge 15c to build up to its final value is a function of the geometries and electrical characteristics of the various parts of the device. FIG. 1d shows the build-up of this charge as a function of time.

Feedback electrode 15, also embedded in insulation 17, has its left end 15l located above the right end 14r of electrode 14. The positive charge 15c in N-type material 12 induces negative charge 15b on the right end 15r of electrode 15. This negative charge in turn induces a positive charge 15a on the left end 15l of electrode 15. Positive charge 15a reduces the amount of positive charge 14e induced in N-type material 12 by balancing out some of the negative charge induced in end 14r of electrode 14. Consequently, the amount of positive charge flowing from P+ type source 13a to form charge 15c is reduced. Feedback electrode 15 can, if desired, be omitted from the structure of FIG. 1a.

Placed over charge 14a is electrode 21-8a associated with charge well 21-8 (FIG. 2). Likewise placed over the charge 15c is electrode 22-7a associated with charge well 22-7 (FIG. 2). The application of a positive potential to the charge electrode associated with charge well 21-9 and a negative potential to the electrode associated with charge well 22-8, results in the charges 14a and 15c being transmitted along the input and output CCD lines. This direction is into the paper on which FIG. 1a is drawn. The drive potentials are derived from clock 24 (FIG. 2). The drive signals from clock 24 are inverted in a well-known manner before being applied to the electrodes associated with one of the CCD lines.

Electrode 16, embedded in insulation 17, is an additional control electrode which allows the charge collected under electrode 15 to be gated into drain 13b or to any other appropriately connected region. Electrode 16 can be controlled independently of the other elements of the structure. Electrode 16 creases additional flexibility in the operation of the circuit. However, if desired, this electrode also can be omitted.

The presence of thermal charge in the same region of p-type material 11 where charge 14a is located results in the generation of additional charge adjacent to charge 15c. This thermal charge, however, occurs randomly and thus has an RMS value beneath that of the amplified signal charge detected in charge well 21-1, when M, the number of amplification stages in the distributed amplifier, is sufficiently large.

Analysis of the structure of this invention discloses that the output signal power $S_T$ is related to the input signal power $S_O$ by the following equation:

$$S_T = M^2 S_O \qquad (2)$$

The total noise output power $N_T$ is related to the random noise power per stage $N_s$ by the following equation:

Thus the ratio of signal output power to noise output power for the charge coupled distributed amplifier is given by the ratio of equation (2) to equation (3) or $$S_T/N_T = MS_o/N_s. \qquad (4)$$

Figure 1B:
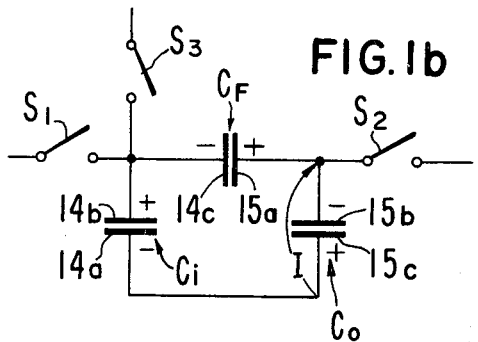
Figure 1C:
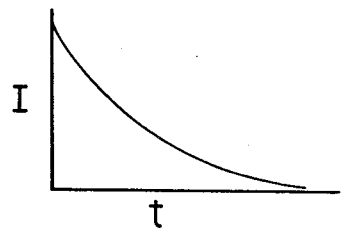
FIGS. 1c and 1d show curves useful in explaining the operation of the circuit of FIG. 1b.
Figure 1D:
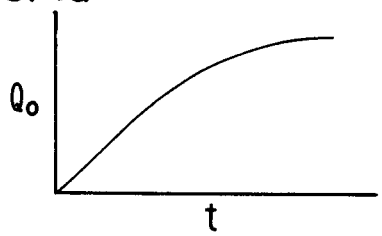

FIG. 1b shows the small-signal schematic circuit diagram of the cross-sectional structure shown in FIG. 1a. The structure essentially is represented by three capacitances, $C_1$, $C_f$ and $C_o$. Switch $S_1$ represents the electrode 21-8a associated with the charge well represented by capacitance $C_i$. Creation of a potential minimum on this electrode is equivalent to closing of the switch $S_1$ allowing current to charge capacitor $C_i$. FIG. 1c shows the current I across capacitor $C_o$ when switch $S_1$ is closed. Charge 14b (FIG. 1a) essentially occupies the top plate of capacitor $C_i$ (FIG. 1b) while charge 14a occupies the bottom plate of this capacitor. Switch $S_3$ represents electrode 21-9a associated with the next charge well 21-9 (FIG. 2) in the input CCD line. Charge 14a (FIG. 1a) is transferred from well 21-8 to well 21-9 by creating a potential minimum on electrode 21-9a. This is equivalent to closing switch S3.

The charge 14c on end 14r of electrode 14 occupies one plate of capacitor $C_f$ while the charge 15a on left end 15l of electrode 15 occupies the other plate of this capacitor. The charge 15b on end 15r of electrode 15 occupies the top plate of capacitor $C_o$ while the charge 15c in the channel region of the MOS structure occupies the bottom plate of capacitor $C_o$. The output charge is obtained by pulsing the electrode 22-8a on the charge well 22-8 (FIG. 2) one removed from the charge well 22-7 in which is stored positive charge 15c (FIG. 1a). This corresponds to closing switch $S_2$ and allows the charge built up on the capacitors to dissipate, thereby restoring zero potential across each of the three capacitors in FIG. 1b.

While this invention has been described with a p-type substrate 11 and an n-type region 12 in which is formed p+ source and drain regions 13a and 13b, it should be understood that a complementary structure can be built according to the principles of this invention by reversing the polarities of each of the regions shown in FIG. 1a and the polarities of the drive signals from clock 24. It should also be noted that regions 13a and 13b can each be biased to insure a current flow through the channel between these regions. Charge 14a (FIG. 1a) then changes the conductivity of the channel region and thus the current flow. This change in current flow due to the presence of electrons can be measured and used to detect the presence of a charge.

When the structure of FIG. 1a is used, the highest signal-to-noise ratio is obtained at the bias point for which a change in gate voltage produces a change of signal power normalized with respect to signal power equal to the change of noise power normalized with respect to noise power.

The gain of the amplifier shown in FIG. 1a is maximum with no feedback. However, as feedback increases, the gain goes down but the stability of the circuit goes up. Instability in the circuit is caused by noise from several possible sources including the clocking signals. In order to know how much feedback is desirable for the circuit, the value of this noise must be known.

Figure 4:
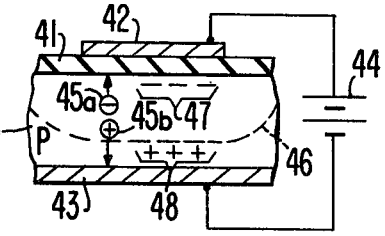
FIG. 4 shows in cross-section a typical charge well.

FIG. 4 shows in more detail the nature of the photosensor comprising the input charge well 21-1. Semiconductor body 40, in this embodiment comprising monocrystalline p-type silicon, has transparent insulation 41 formed on its top surface. Typically, this insulation comprises silicon dioxide although it could, if desired, consist of a plurality of layers of different insulating materials. Transparent electrode 42 is placed over insulation 41 and is connected to the positive terminal of a bias source 44. The negative terminal of bias source 44 is connected to electrode 43 placed on the bottom surface of monocrystalline body 40. The bias source 44 produces a depletion region represented by dashed line 46 in body 40 beneath transparent electrode 42. Radiation incident upon body 40 passes through transparent electrode 42 and insulation 41 and creates hole-electron pairs in depletion region 46. The electrons, such as electron 45a, travel to the upper surface of semiconductor body 40 in response to the bias field provided by bias source 44 to form charge region 47 in the vicinity of the surface of body 40. It should be noted that the number of electrons 45a which can be accumulated to form the charge 47 depends, among other variables, upon the size of electrode 42. For a typical capacitance of $2 \times 10^{-5}$ farads at a one-half volt bias, about 6,000 electrons are required to saturate charge well 21-1. This capacitance corresponds to a 0.1 by 0.2 mil electrode 42 on a 1300 A silicon dioxide insulation. Before saturation, the speed with which charge 47 can be transferred from one charge well to another drops because more charge must be transferred. Saturation shows up as a loss of contrast between two sequential samples of the charge intensities built up by radiation incident on input charge well 21-1. This loss of contrast is caused by charge from a previous image remaining in charge well 21-1 and adding to the charge generated over the next charge storage period.

Figure 5:
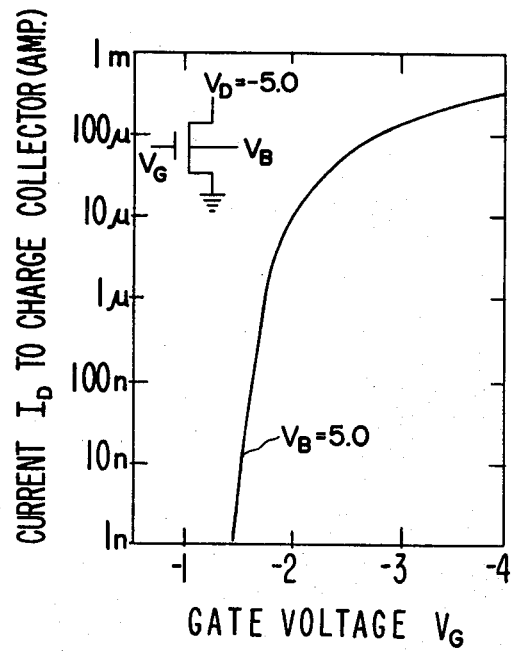

It should be noted that the charge amplifier shown in cross-section in FIG. 1a likewise can saturate. The amplifier comprises electrode 14 together with p+ source 13a. The negative charge 14c on the right end 14r of electrode 14 controls the conductivity of a channel region extending from source 13a to the region of n-type material 12 in which charge 15c is stored. Charge flows from source 13a until a given amount of charge 15c accumulates and then the charge flow stops. The current flow versus gain voltage characteristic of source 13a and the channel region between source 13a and the stored charge 15c is given in FIG. 5. For a typical initial gate voltage of minus 2.0 volts, the drain current is approximately 10 microamps. As the amount of charge 14a (FIG. 1a) decreases, the rate of charge flow from source 13a drops. It may drop an order to more in magnitude in 100 nanoseconds in a typical design.

Figure 3A:
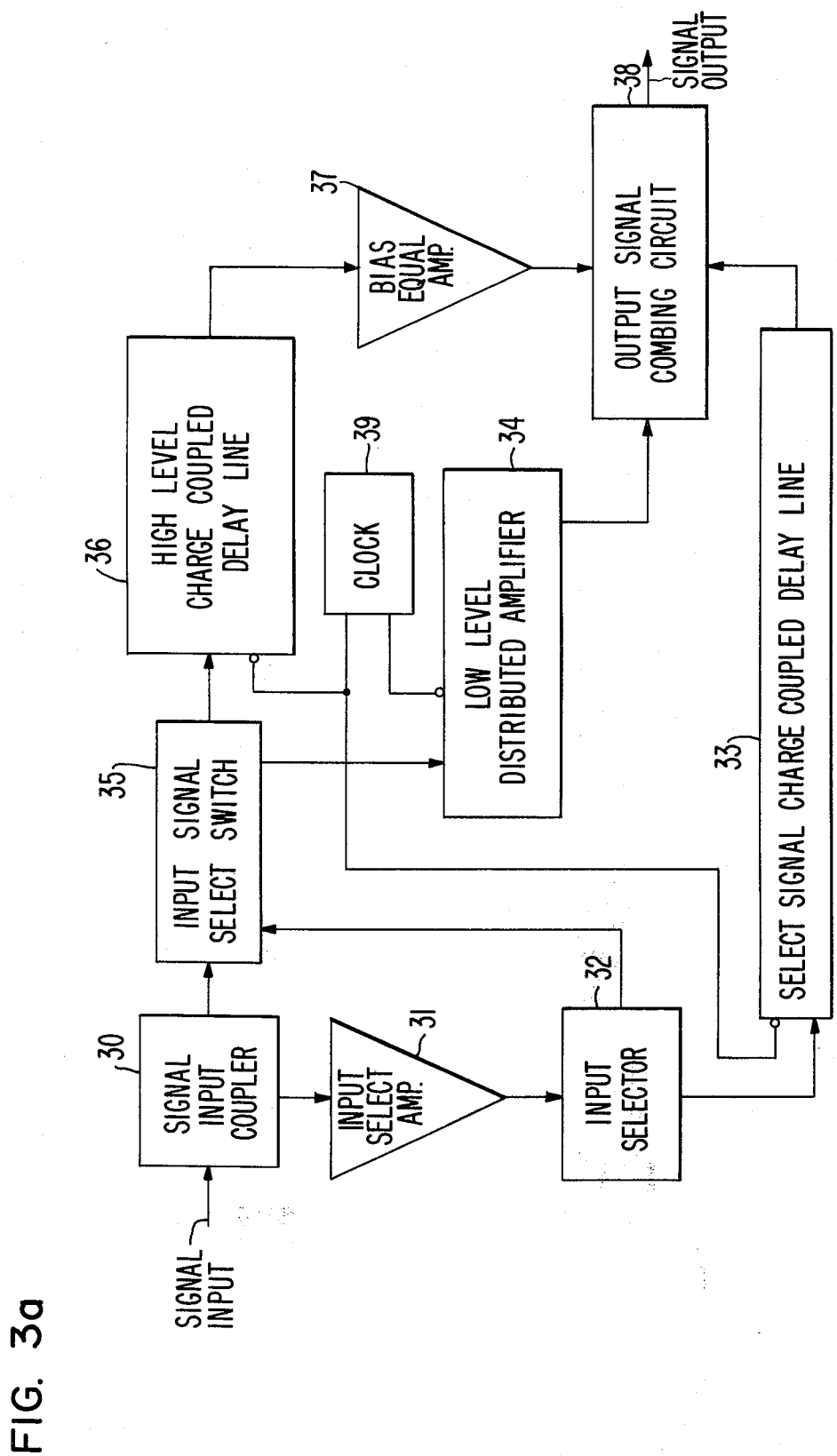
FIG. 3a shows schematically a charge coupled amplifier with wide dynamic range.

In some situations a photosensor should be able to sense signals with amplitudes varying over a range of $10^6$. FIG. 3a shows a system for handling signals which vary over this range. The useful range for the distributed floating gate amplifier 34 is from 1 to $10^3$ electrons. Saturation of the floating gate in a typical structure as shown in FIG. 1a with an electrode structure 14l of 0.1 by 0.2 mils occurs at about $5 \times 10^4$ electrons. However, it is desirable that the photosensor 21-1 work both night and day. Therefore, a large electrode is provided for the first floating gate amplifier. Signal input coupler 30 comprises the left end 14l of electrode 14 (FIG. 1a). Electrode 14 and end 14r comprises input select amplifier 31. The charge 14a generated by incident radiation, typically light, generates a corresponding output charge 15c. This output charge is detected by input selector 32 which compares this output charge to a reference level.

If this reference level is above a given threshold, this means that the incident radiation is above the useful range of the low level distributed floating gate amplifier 34, which typically is similar to the amplifier shown in FIG. 2. Accordingly, a signal is transmitted to input signal select switch 35 which routes the charge 14a (FIG. 1a) directly to a high-level charge coupled delay line. Such a delay line would comprise merely the input CCD line of FIG. 2 with appropriately sized electrodes over charge wells 21-1 through 21-j. If, however, the charge detected in input charge well 21-1 is smaller than a given amount, as measured by input selector 32, input signal select switch 35 routes this charge to low level distributed amplifier 34. Such a distributed amplifier is as shown in FIG. 2. The high level charge coupled delay line 36 and the low level distributed amplifier 34 are both driven by a drive signal obtained from clock 39. The charge driven through either high-level delay line 36 or low level distributed amplifier 34 is detected in output signal combining circuit 38. However, it should be noted that the charge transmitted through low level distributed amplifier 34 has been amplified while the charge transmitted along high level delay line 36 has not been amplified. Accordingly, bias equalization amplifier 37 is provided to place the level of the signal obtained from delay line 36 into the proper relationship to the signal obtained from low level distributed amplifier 34.

Select signal charge coupled delay line 33 transmits a signal to output signal combining circuit 38 to instruct circuit 38 as to whether the signal detected is a low level or a high level signal. Circuit 38 then appropriately gates the output signal from either bias equalization amplifier 37 or low level distributed amplifier 34 to the output circuitry (not shown).

Figure 3B:
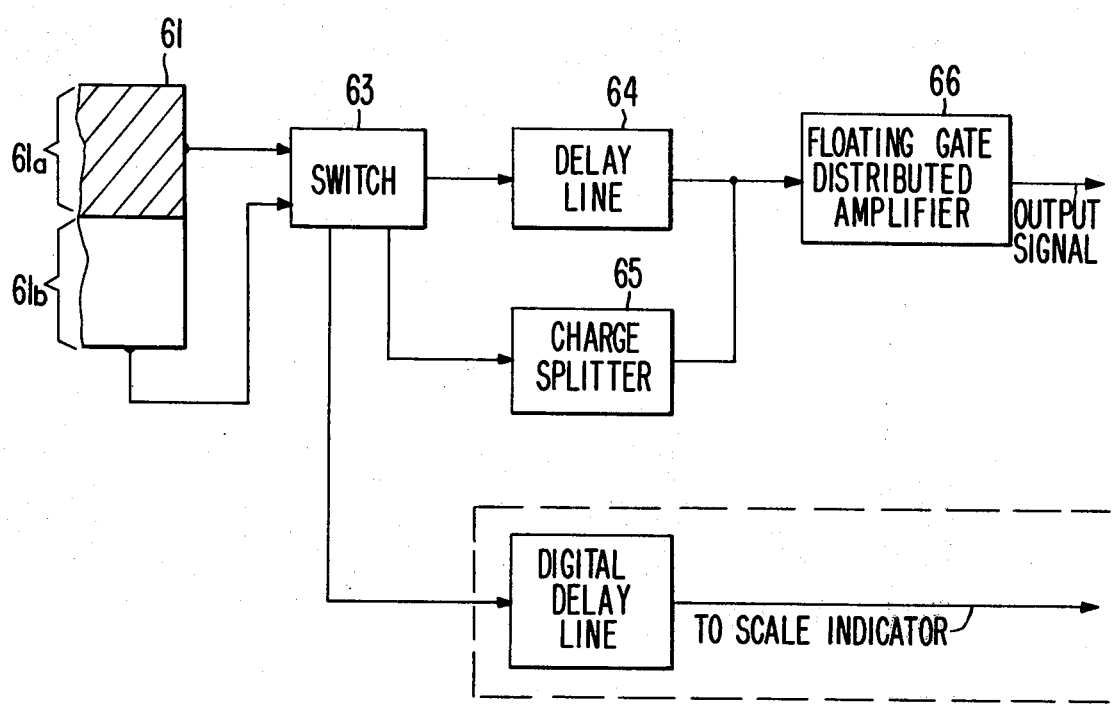
FIG. 3b shows schematically an alternative embodiment of a charge coupled amplifier with wide dynamic range.

FIG. 3b shows an alternative embodiment of this invention suitable for obtaining useful output signals from an input signal which can have an amplitude over a $10^6$ range. The charge generated by incident radiation forms beneath portion 61a of electrode 61. Electrode 61, which might, for example, be comparable to electrode 14 in FIG. 1a, is selected to be a size sufficient to contain beneath portion 61a the largest charge capable of being generated by the highest level of incident radiation for which the system is designed. The charge formed beneath portion 61a of electrode 61 induces an opposite charge in portion 61a of electrode 61. This opposite charge in turn induces a charge of the same type as the induced charge in end 61b of electrode 61.

The charge at end 61b of electrode 61 controls the setting of switch 63. Switch 63 passes the induced charge beneath portion 61a of electrode 61 to either delay line 64 or charge splitter 65, depending upon the amplitude of the induced charge. If the induced charge is above the saturation level of the charge wells comprising floating gate distributed amplifier 66, which can in one embodiment be as described in FIG. 2, then this charge is transmitted by switch 63 to charge splitter 65. Charge splitter 65 reduces the detected charge by a given amount, for example, to 1/100 of its initial value. The reduced charge is then transmitted to floating gate distributed amplifier 66 and then amplified as described above in conjunction with FIG. 2.

If, however, the induced charge is less than the magnitude at which floating gate distributed amplifier 66 will saturate, switch 63 routes this charge directly to delay line 64. Delay line 64 (which can be analog or digital) ensures that regardless of how the chrge is routed by switch 63, the charge will arrive at the input to distributed amplifier 66 at the same time. The system's output signal is obtained from distributed amplifier 66. A signal from switch 63, which is passed through digital delay line 67 to synchronize this signal with the output signal from amplifier 66, gives the scale of the output signal from amplifier 66.

While the distributed amplifier shown in FIG. 2 is shown with the charge wells in the input CCD line and the output CCD line arranged in straight, parallel lines, other arrangements of these charge wells can be used. These charge wells can be arranged in circular patterns or in any other geometric pattern suitable and advantageous for obtaining an efficient layout on a semiconductor chip.

Furthermore, while the structure of FIG. 2 shows a charge amplifier located between every third pair of charge wells, if desired, charge amplifiers can be located between every pair of charge wells. Thus in the structure shown in FIG. 2, rather than M amplification stages, the structure would then have 3M amplification stages.

It should be noted that the dark current associated with the CCD structure of this invention can be reduced significantly by cooling the structure using standard cooling techniques. Such a procedure will significantly improve the signal-to-noise ratio of the CCD structures disclosed.

While several embodiments of this invention have been described, numerous other embodiments lie within the scope of this invention and will be obvious to those skilled in the semiconductor arts in view of this disclosure.

What is claimed is:

1. A clocked charge coupled distributed amplifier comprising:
   semiconductor material;
   insulation overlying and adherent to one surface of said semi-conductor material;
   a first plurality of electrodes formed along a first selected line on said insulation, said electrodes together with the underlying regions of said semiconductor material and said insulation comprising a first plurality of means for storing charge;
   a second plurality of electrodes formed on said insulation and arranged along a second selected line, said second plurality of electrodes together with the underlying regions in said semiconductor material and said insulation comprising a second plurality of means for storing charge;
   a multiplicity of amplifier means, each amplifier means electrically coupling one means for storing charge in said first plurality of means for storing charge to a corresponding means for storing charge in the second plurality of means for storing charge, each amplifying means comprising an electrode embedded in said insulation, one end of said electrode resting over but insulated from the region of semiconductor material in a selected means for storing charge in said first plurality of means for storing charge, and the other end of said electrode being arranged over, but insulated from, a channel region extending from a source region formed in said semi-conductor material, each amplifier means being spaced from its adjacent amplifier means by $(n-1)$ means for storing charge, where n is an integer representing the number of clock signal phases used in driving charge along said first plurality of means for storing charge and said second plurality of means for storing charge;
   means for simultaneously driving charge in the same direction along said first plurality of means for storing charge and said second plurality of means for storing charge; and
   means for detecting the charge accumulated at a selected one of the second plurality of means for storing charge.

2. Structure as in claim 1 wherein said first plurality of means for storing charge comprises an input charge coupled device line which includes an input means for storing charge and K means for storing charge where K is an integer equal to one less than the number of means for storing charge in said first plurality of means for storing charge, said input means for storing charge and said K means for storing charge being arranged so as to allow charge from said input means for storing charge to be transferred along said K means for storing charge.

3. Structure as in claim 1 wherein said second plurality of means for storing charge comprises an output charge coupled device line, each means for storing charge in said output charge coupled device line being arranged so as to allow charge to be transferred along said output charge coupled device line.

4. Structure as in claim 1 wherein each of said multiplicity of amplifier means connects a corresponding means for storing charge in said first plurality of means for storing charge to a corresponding means for storing charge in said second plurality of means for storing charge.

5. The combination comprising:
   a charge transfer register having a plurality of stages, said register adapted to receive a charge signal and including means for transferring said signal from stage-to-stage along said register;
   a multiplicity of amplifying means spaced along said register; each amplifying means having an input coupled to a different one of said stages of said register for sensing said charge signal and having an output point for producing thereat an output signal in response to said charge signal;
   a common output point; and
   means for summing the charge signals produced at the output points of said amplifying means, including charge transfer means coupled between said output points of said amplifying means and said common output point.

6. The combination as claimed in claim 5 wherein said charge transfer register is of the charge coupled type.

7. The combination as claimed in claim 5 wherein each one of said amplifying means is a charge amplifier which in response to a given charge signal at its input produces an increased charge signal at its output.

8. The combination as claimed in claim 5 wherein said charge transfer means of said summing means are of the charge-coupled type.

9. The combination as claimed in claim 5 wherein said charge transfer means of said summing means provide different delays between said output points of said amplifying means and said common point for bringing the output signals produced at said output points into coincidence at said common point.

10. The combination comprising:
    an input point for the application thereto of input signals; and an output point for the production thereat of amplified signals;
    an input charge transfer register having an input terminal connected to said input point and a plurality of output nodes;
    means coupled to said input register for transferring charge signals corresponding to said input signals from output node to output node along said input register;
    a plurality of charge amplifiers, each amplifier having an input terminal connected to a different one of said output nodes and an output terminal; and
    charge transfer summing means connected between each one of said output terminals of said amplifiers and said output point for delaying the siganls produced at said output terminals by different amounts to bring them into time coincidence at said output point.

11. The combination as claimed in claim 10 wherein said charge transfer summing means includes a transfer register having a multiplicity of input nodes and an output node; and means for connecting different ones of said output terminals of said amplifying means to different ones of said input nodes of said summing register; and
    means coupling the output node of said summing register to said output point.

* * * * *